United States Patent [19]
Suwa

[11] Patent Number: 5,903,033
[45] Date of Patent: May 11, 1999

[54] SEMICONDUCTOR DEVICE INCLUDING RESISTANCE ELEMENT WITH SUPERIOR NOISE IMMUNITY

[75] Inventor: Makoto Suwa, Hyogo, Japan

[73] Assignee: Mitsubishi Denki Kabushiki Kaisha, Tokyo, Japan

[21] Appl. No.: 08/876,753

[22] Filed: Jun. 16, 1997

[30] Foreign Application Priority Data

Nov. 29, 1996 [JP] Japan .................................. 8-319402

[51] Int. Cl.$^6$ .................................................. H01L 23/62

[52] U.S. Cl. .......................... 257/358; 257/359; 257/379; 257/380; 257/381

[58] Field of Search ..................... 257/358, 359, 257/379, 380, 381, 536

[56] References Cited

U.S. PATENT DOCUMENTS

| | | | |
|---|---|---|---|
| 5,327,224 | 7/1994 | Ikegami et al. | 257/380 |
| 5,440,162 | 8/1995 | Worley et al. | 257/355 |
| 5,479,045 | 12/1995 | Narahara et al. | 257/533 |

FOREIGN PATENT DOCUMENTS

| | | |
|---|---|---|
| 57-7150 | 1/1982 | Japan . |
| 3-16164 | 1/1991 | Japan . |
| 3-129762 | 6/1991 | Japan . |

*Primary Examiner*—Valencia Martin-Wallace
*Attorney, Agent, or Firm*—McDermott, Will & Emery

[57] ABSTRACT

A well region is provided on a doped semiconductor layer. A resistor element is formed on the well region and a fixed voltage level is applied. A parasitic capacitance is formed between the well region and the resistor and a noise generated at one end of the resistor is compensated for or filtered by the parasitic capacitance.

18 Claims, 10 Drawing Sheets

5,903,033

SEMICONDUCTOR DEVICE INCLUDING RESISTANCE ELEMENT WITH SUPERIOR NOISE IMMUNITY

BACKGROUND OF THE INVENTION

1. Field of the Invention

The present invention relates to a semiconductor device including a resistance element as its component, and particularly to circuitry in which erroneous operation due to noise in the resistance element region can be prevented as well as to its layout. More particularly, the present invention relates to a structure for improving noise immunity of an internal power supply voltage generating circuit in a semiconductor memory device.

2. Description of the Background Art

In a semiconductor device, resistance elements are employed in various portions for regulation and/or generation of voltage and current. As an example of circuitry utilizing resistance elements, consideration is made on a voltage down converter in a dynamic random access memory (DRAM). This internal voltage down converter down-converts an external supply voltage internally to produce an internal supply voltage lower than the external supply voltage. By utilizing the supply voltage which has been internally down-converted, compatibility with memories of earlier generations is maintained while commaring breakdown voltage characteristics of the elements which have been miniaturized as storage capacity has been made larger.

FIG. 13 schematically shows an entire structure of a conventional dynamic random access memory. Referring to FIG. 13, a dynamic random access memory 1 includes an internal voltage down converter 3 for receiving and down-converting an external supply voltage extVcc applied externally to terminal 2 so as to produce an internal supply voltage intVcc, a control circuit 4 operating with internal supply voltage intVcc from internal voltage down converter 3 as its one operational supply voltage to perform controls required for selection of a memory cell and writing/reading of data in accordance with externally applied signals, and a memory array 5 including a plurality of dynamic type memory cells arranged in a matrix.

Control circuit 4 receives a row address strobe signal /RAS for instructing the start of memory cell row selecting operation, a column address strobe signal /CAS for instructing the start of memory cell column selecting operation of memory array 5, a write enable signal /WE for designating data writing operation, an output enable signal /OE for instructing data output, and an address signal An.

Memory array 5 also includes various peripheral circuits such as a sense amplifier provided corresponding to each of the memory columns for sensing and amplifying memory cell data on a corresponding column, a decoder for decoding address signals applied from control circuit 4 to select a memory cell row and a memory cell column of memory array 5, a column selecting gate for connecting the selected column to internal data bus (not shown explicitly), and an equalizing/precharging circuit for precharging and equalizing each of the memory cell columns at a prescribed potential. These peripheral circuits of the memory array are also operated with internal supply voltage intVcc from internal voltage down converter 3 as one operational supply voltage.

Dynamic random access memory 1 further includes an input circuit 6 operating with internal supply voltage intVcc from internal voltage down converter 3 as its one operational supply voltage for producing internal write data from external write data DQn applied to data input/output terminal 7 under the control of control circuit 4 for writing into a selected memory cell of memory array 5, and an output circuit 8 operating with internal supply voltage intVcc as one operational supply voltage for converting the data of selected memory cell of memory array 5 into external read out data at the level of external supply voltage extVcc under the control of control circuit 4 and outputting it to data input/output terminal 7.

In this dynamic random access memory 1, when row address strobe signal /RAS is changed to an active state of L level, with address signal An applied currently used as the row address a row selecting operation at memory array 5 is performed and data of the memory cells connected to the selected row are sensed, amplified and latched by sense amplifiers. Then, when column address strobe signal /CAS is driven to L level of active state, column selecting operation is started in memory array 5 according to address signal An applied currently. When write enable signal /WE is at L level in an active state, input circuit 6 is activated, internal write data is produced from data DQn applied to data input/output terminal 7 to be written into the memory cell arranged corresponding to intersection of the selected row and the selected column of memory array 5. Upon activation of output enable signal /OE, output circuit 8 is activated and data of the selected memory cell of memory array 5 is converted to the level of external supply voltage extVcc to be output to data input/output terminal 7.

Internal voltage down converter 3 includes a reference voltage generating circuit 10 for generating a constant reference voltage Vref having no dependency on external supply voltage extVcc from external supply voltage extVcc when this external supply voltage extVcc is at a prescribed voltage level, and an internal voltage generating circuit 12 for producing internal supply voltage intVcc from external supply voltage extVcc in accordance with reference voltage Vref generated from this reference voltage generating circuit 10. Internal voltage generating circuit 12 produces internal supply voltage intVcc having a level substantially equal to the level of this reference voltage Vref on internal power supply line 13.

FIG. 14 shows an example of a specific structure of reference voltage generating circuit 10 and internal voltage generating circuit 12 in internal voltage down converter 3 of FIG. 13. Referring to FIG. 14, reference voltage generating circuit 10 includes a constant current generating circuit 10a coupled between power supply node 2a supplied with external supply voltage extVcc and a ground node for generating a constant current i0 having no dependency on this external supply voltage extVcc, and a constant voltage generating circuit 10b connected between power supply node 2a and the ground node for converting constant current i0 from constant current generating circuit 10a into voltage to generate a constant reference voltage Vref having no dependency on external supply voltage extVcc.

Internal voltage generating circuit 12 compares this reference voltage Vref with internal supply voltage intVcc on internal power supply line 13, supplies current from power supply node 2a to internal power supply line 13 according to the result of comparison, holds internal supply voltage intVcc at the level of reference voltage Vref.

Constant current generating circuit 10a includes a resistance element R0 of high resistance connected between power supply node 2a and node N1; a p channel MOS transistor Q1 having one conduction node (source) connected to power supply node 2a, the other conduction node (drain) connected to node N2 and a control gate connected to node N1; a p channel MOS transistor Q2 having one conduction node connected to node N1, the other conduction node connected to node N3 and a control gate connected to node N2; an n channel MOS transistor Q3 having one conduction node (drain) connected to node N2, the other conduction node connected to the ground node and a control gate connected to power supply node 2a; and an n channel MOS transistor Q4 having its one conduction node and control gate connected to node N3 and the other conduction node connected to the ground node.

The channel length of L of MOS transistor Q3 is made sufficiently longer than that of MOS transistor Q1, and current driving capability of MOS transistor Q3 is made sufficiently smaller than that of MOS transistor Q1. Resistance element R0 has a large resistance value such as several hundred KΩ to 1MΩ. Operation of this constant current generating circuit will now be described in the following.

When power supply voltage extVcc is applied externally and its voltage level is made higher to cause current to flow through resistance element R0, voltage drop occurs across this resistance element R0. Node N1 is connected to the control gate of p channel MOS transistor Q1. Accordingly, when the voltage drop across this resistance element R0 exceeds the absolute value of threshold voltage of MOS transistor Q1, this MOS transistor Q1 is rendered conductive, so that current flows from power supply node 2a through MOS transistors Q1 and Q3.

As described above, MOS transistor Q3 has its channel length L sufficiently long and its current driving capability sufficiently smaller than that of MOS transistor Q1. Meanwhile, node N2 is connected to the control gate of p channel MOS transistor Q2 which also supplies current from resistance element R0 to MOS transistor Q4 according to the potential at node N2. Resistance element R0 is a resistor formed of, for example, polycrystalline silicon layer and has a high resistance value. The current flowing to MOS transistors Q2 and Q4 is sufficiently small.

When the potential at node N1 is made higher, the conductance of MOS transistor Q1 is reduced, which leads to reduction in amount of current flowing to node N2. Then, the potential at node N2 is lowered, and the conductance of MOS transistor Q2 is made higher, so that large amount of current is caused to flow and the potential at node N1 is made lower. On the contrary, when the potential at node N1 is made lower, the conductance of MOS transistor Q1 is made higher so that the potential at node N2 is increased and the amount of current flowing through MOS transistor Q2 is reduced. Owing to this feedback operation of MOS transistors Q1 and Q2, the current flowing to MOS transistors Q1 and Q2 is made constant. Since the current driving capability of MOS transistor Q3 is sufficiently small, the voltage between the gate and the source of this MOS transistor Q1 is established at Vth(p). Here, Vth(p) represents the absolute value of the threshold voltage of each of MOS transistors Q1 and Q2. That is, a potential of node N1 would be extVcc−Vth(p). Accordingly, current i0 flowing through resistance element R1 would be expressed as:

$$i0=Vth(p)/R0$$

where the resistance value of resistance element R0 is indicated by an identical reference character R0. This resistance value R0 is, as has been mentioned before, as high as several hundred KΩ to 1MΩ. Also, current i0 is of a sufficiently low value. Source-gate voltage of MOS transistor Q2 would be Vth(p). Thus, potential V(N2) of node N2 would be represented in the following expression:

$$V(N2)=V(N1)-Vth(p)=extVcc-2\cdot Vth(p)$$

where V(N1) indicates the voltage of node N1. Accordingly, source-drain voltage of p channel MOS transistor Q1 is a constant voltage 2·Vth(p) having no dependency on external supply voltage extVcc. Similarly, the gate-source voltages of MOS transistors Q1 and Q2 would also be constant voltage (Vth(p)) having no dependency on external power supply voltage extVcc. Accordingly, the difference between the voltage of node N1 and external supply voltage extVcc of power supply node 2a would also be of a constant value of Vth(p). Current i0=Vth(p)/R0 flowing through this resistance element R0 and MOS transistors Q2 and Q4 would also be constant. Thus, constant current having no dependency on external supply voltage extVcc is obtained.

Constant voltage generating circuit 10b includes an n channel MOS transistor Q5 connected between node N4 and a ground node and having its gate connected to node N3, a p channel MOS transistor Q6 connected between power supply node 2a and node N4 and having its control gate connected to node N4, a p channel MOS transistor Q7 connected between power supply node 2a and node N5 and having its gate connected to node N4, and a resistance element R1 connected between node N5 and the ground node. Reference voltage Vref is output from node N5. Operation of this constant voltage generating circuit 10b will now be described in the following.

MOS transistors Q4 and Q5 form a current mirror circuit. If they have the same size (i.e., ratio of channel length to channel width), the current flowing to MOS transistor Q5 would be of the same magnitude as the current i0 flowing through MOS transistor Q4. MOS transistors Q6 and Q7 form a current mirror circuit. If they have the same size, the current flowing through these MOS transistors Q6 and Q7 would be of same magnitude. Current i0 flows to MOS transistor Q5, and then through MOS transistor Q6, and accordingly, to MOS transistor Q7. Assuming that the resistance value of resistance element R1 is expressed as R1, voltage generated at node n5 is i0·R1. Therefore, reference voltage Vref output from this node N5 is represented by the following expression.

$$Vref=i0\cdot R1=Vth(p)\cdot R1/R0$$

As is clearly understood from the above expression, this reference voltage Vref is determined by the resistance value of resistance elements R0 and R1 as well as threshold voltages of MOS transistors Q1 and Q2, and is at a constant voltage level having no dependency on external supply voltage extVcc. The internal voltage generating circuit generates internal supply voltage intVcc according to this reference voltage Vref.

Internal voltage generating circuit 12 includes an n channel MOS transistor Q8 connected between node N6 and node N8 and receiving reference voltage Vref at its gate, an n channel MOS transistor Q9 connected between node N7 and node N8 and having its gate connected to internal power supply line 13, a p channel MOS transistor Q10 connected between power supply node 2a and node N6 and having its gate connected to node N7, a p channel MOS transistor Q11 connected between power supply node 2a and node N7 and having its gate connected to node N7, an n channel MOS transistor Q12 connected between node N8 and the ground node and receiving an activation signal φ at its gate, and a p channel MOS transistor Q13 connected between power supply node 2a and internal power supply line 13 and having its gate connected to node N6. Activation signal φ is activated when the dynamic random access memory is in an active state, that is, when the memory cell selecting operation is being performed. Operation of this internal voltage generating circuit 12 will now be described in the following.

MOS transistors Q8 and Q9 form a differential comparison stage. When internal supply voltage intVcc on internal power supply line 13 is higher than reference voltage Vref, MOS transistor Q9 would have a conductance higher than that of MOS transistor Q8 and the current flowing through it would be larger than the current flowing through MOS transistor Q8. Current is supplied to this MOS transistor Q9 via MOS transistor Q11. MOS transistors Q11 and Q10 form a current mirror circuit in which the current flowing through MOS transistor Q10 is of the same magnitude as the current flowing through MOS transistor Q11. Accordingly, in this state, MOS transistor Q8 cannot discharge all of the current supplied via MOS transistor Q10, the potential of node N6 is made higher, the gate potential of MOS transistor Q13 is made higher, and MOS transistor Q13 would supply smaller amount of current or would supply no current.

On the contrary, when internal supply voltage intVcc is lower than reference voltage Vref, the conductance of MOS transistor Q8 would be larger than the conductance to MOS transistor Q9. In this case, conversely, MOS transistor Q8 will discharge all of the current supplied via MOS transistor Q10 to lower the potential of node N6, and thus MOS transistor Q13 would have a larger conductance and would supply current from power supply node 2a to internal power supply line 13 so as to raise internal supply voltage intVcc on internal power supply line 13. Therefore, upon operation of internal voltage generating circuit 12, the level of internal supply voltage intVcc is maintained at the level of reference voltage Vref.

During standby, activation signal φ is at L level in an inactive state, and MOS transistor Q12 is turned off. This internal voltage generating circuit 12 is inactivated, changes the voltage level of node N6 to the level of external supply voltage extVcc, and turns off MOS transistor Q13.

FIG. 15A schematically shows a two-dimensional layout of resistance element R0 included in constant current circuit 10a. As is shown in FIG. 15, resistance element R0 includes a plurality of first resistance portions Ra extending in the vertical direction in the drawing, and second resistance portions Rb for alternately connecting one-side ends of the adjacent first resistance portions Ra. The opposite ends of resistance element R0 are electrically connected to power supply node and node N1 respectively via contact holes Na and Nb. Resistance element R0 is formed of polycrystalline silicon. In this resistor using polycrystalline silicon, its sheet resistance is relatively low. Accordingly, in order to form a large resistance value ranging from several hundreds of KΩ to several MΩ required in the constant current circuit within a limited small area, the plurality of first resistance portions Ra having small line width are arranged in parallel and are electrically connected in an alternating manner to form a zigzag shape so that the entire length of this resistance element R0 would be equivalently increased so as to implement a high resistance value.

FIG. 15B is a schematic diagram of a cross sectional structure taken along line 15A—15A of FIG. 15A. Normally, such resistance element R0 is formed on a semiconductor substrate P-SUB with a field insulating film FD having a large thickness therebetween, in order to reduce the parasitic capacitance between the element and the substrate. Semiconductor substrate P-SUB is a P type semiconductor layer which is normally fixed at the level of bias voltage VBB of negative potential.

In this structure shown in FIG. 15B, parasitic capacitance Cp is formed between each of first resistance portions Ra and semiconductor substrate P-SUB. Although not shown in FIG. 15B, second resistance portion Rb has a parasitic capacitance to semiconductor substrate P-SUB. When the resistance value of this resistance element R0 is high and its entire length is made longer, the value of combined parasitic capacitance Cpara of this parasitic capacitance Cp is increased to an unnegligible value. The following is a description on the influence of this parasitic capacitance Cpara to the operation of the circuitry.

FIG. 16A shows how parasitic capacitance Cpara is connected in constant current generating circuit 10a. Although parasitic capacitance Cpara is arranged dispersedly over resistance element R0, it is shown equivalently as one combined parasitic capacitance Cpara in FIG. 16A.

Now, the operation of constant current generating circuit 10a shown in FIG. 16A during the rise in external supply voltage extVcc is described with reference to the waveforms shown in FIG. 16B.

Until time t0, external supply voltage extVcc is stabilized at the level of voltage V1. Under this state, the potential of node N1 is V1–Vth(p) as has been already described. Accordingly, current i0 flowing through resistance element R0 is expressed as follows.

$$i0=(extVcc-V(N1))/R0=Vth(p)/R0$$

Reference voltage Vref produced by constant current i0 is also maintained at a prescribed voltage level.

At time t0, external supply voltage extVcc starts rising and attains the level of voltage V2 at time t1. When parasitic capacitance Cpara is not present, the potential of node N1 is increased in accordance with the rise of this external supply voltage extVcc with a constant difference (Vth(p)) as shown by a solid line in FIG. 16B. However, since parasitic capacitance Cpara is present with respect to resistance element R0, increase in potential at node N1 is moderate in accordance with time constant determined by resistance element R0 and the capacitance value of parasitic capacitor Cpara, as shown by broken line in FIG. 16B.

During the period between time t0 to time t1, voltage across resistance element R0 between power supply node 2a and node N1 is made higher than voltage Vth(p). Therefore, in this state, current i0 is increased (since extVcc–V(N1) >Vth(p)), and accordingly, the level of reference voltage Vref is also made higher. Reference voltage Vref is made higher in accordance with this rise of external supply voltage extVcc, and the level of internal supply voltage intVcc is also raised correspondingly.

A transistor of miniaturized internal circuitry is operated according to this internal supply voltage intVcc, and therefore, a problem arises in which the breakdown voltage characteristics of the components of the internal circuitry is degraded. In addition, since the signal amplitude of this internal circuitry changes corresponding to the increased internal power supply voltage, there would be a problem that power dissipation is increased. Moreover, the MOS transistor (insulating gate type field effect transistor) which is a component of the internal circuitry would have its gate potential increased according to increase in this internal power supply voltage intVcc (since the voltage level of the internal signal is made higher) so that operation speed is also changed, changing the timing of defining of the internal signals and leading to a possibility of erroneous operation in the internal circuitry.

When external power supply voltage extVcc is made constant at the level of voltage V2 at time t1, the difference between this external power supply voltage extVcc and the voltage at node N1 is gradually reduced, the current value of constant current i0 is also gradually reduced to finally attain a desired current value (Vth(p))/R0, and accordingly, reference voltage Vref is also recovered to a prescribed voltage level.

Similarly, when the level of external power supply voltage extVcc is lowered, reduction rate in the voltage at node N1 is made moderate. The voltage across resistance element R0 is reduced to be lower than a prescribed voltage level Vth(p), and according to this reduction, the value of constant current i0 is reduced to be lower than a predetermined value. According to this reduction, reference voltage Vref is also lowered, and internal power supply voltage intVcc is also lowered. Accordingly, in this state, there occurs a possibility that the internal circuitry may perform an erroneous operation due to a bump of internal power supply voltage.

When polycrystalline silicon resistor is employed for resistance element R0 as described above, its large parasitic capacitance degrades the response characteristics for variation of external supply voltage extVcc of constant current generating circuit and the internal supply voltage may be varied through this variation in the constant current.

This problem of response characteristics being degraded by the parasitic capacitance accompanying the resistance element occurs not only with the resistance element connected to a source of the constant voltage such as external power supply voltage as described above, but also with a resistance element generally provided in a signal propagating path. In this case, the signal cannot be conducted with high speed, and fast operation is inhibited.

In addition, a low pass filter formed of resistance element and a capacitor is generally used in order to prevent such influence of the noise, but when such a low pass filter is employed, the capacitor requires a relatively large layout area, although it is desirable to reduce the area occupied by this capacitor as much as possible from the aspect of integration.

SUMMARY OF THE INVENTION

It is an object of the present invention to provide a semiconductor device including resistance elements and having a superior noise immunity.

It is another object of the present invention to provide a constant current generating circuit which can supply constant current in a stabilized manner even when power supply noise is generated.

It is still another object of the present invention to provide an internal voltage down converter which can produce an internal supply voltage of a constant voltage level in a stabilized manner even when power supply noise is generated.

A specific object of the present invention is to provide an internal supply voltage down converter for a semiconductor memory device which can produce an internal supply voltage in a stabilized manner without being influenced by the noise at an external supply voltage.

Another specific object of the present invention is to provide a low pass filter occupying a small layout area.

Still another specific object of the present invention is to provide a resistance element structure which can conduct signals with high speed.

The semiconductor device in accordance with the present invention includes a resistance element formed on semiconductor layer of a first conductivity type with an insulating film therebetween, a semiconductor region of a second conductivity type formed on the surface of semiconductor layer opposite to the entire region where this resistance element is formed, and voltage supplying circuit for supplying a voltage of a particular node to the above-described semiconductor region.

A semiconductor region supplied with the voltage of the particular node is provided opposite to the region where the resistor element is formed. When this particular node is connected to one end of the resistance element, the parasitic capacitance between resistance element and the semiconductor region acts as coupling capacitance and conducts the change in potential at the particular node also to the other end of this resistor element so as to hold the voltage applied between the two ends of the resistor element at a constant level. In addition, by connecting this particular node to a node different from both ends of the resistant element and fixing its potential, parasitic capacitance between this resistance element and the semiconductor region can be utilized positively to implement a low pass filter formed of the resistor element and the parasitic capacitance which occupies small area.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1A:
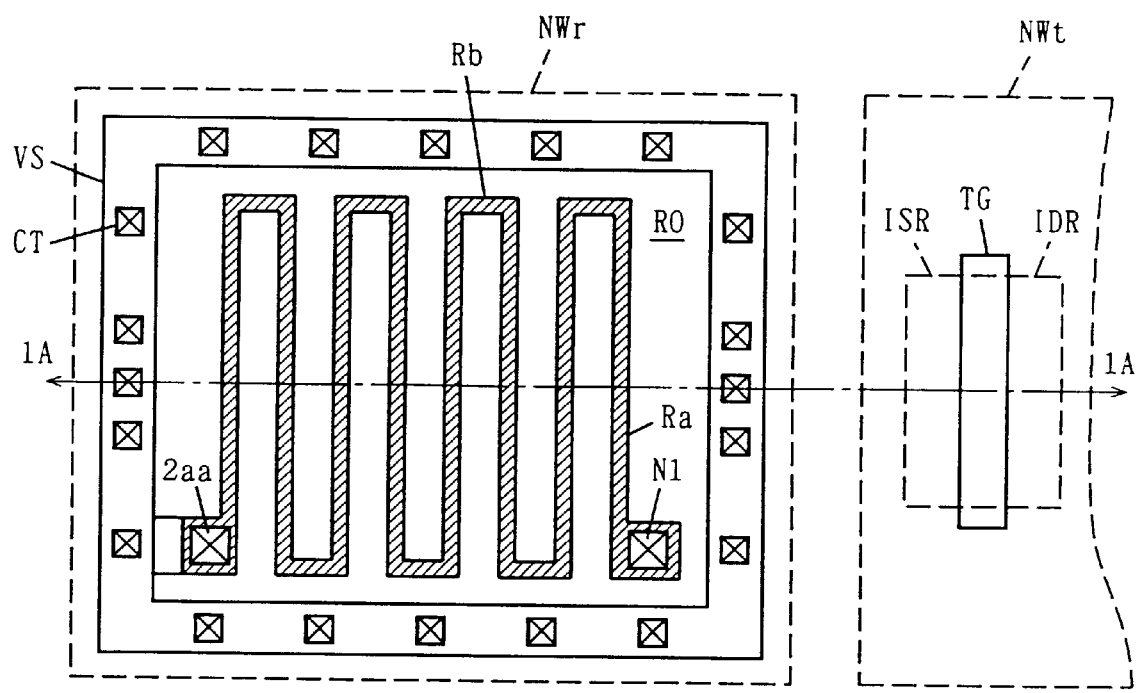
FIGS. 1A and 1B are schematic diagrams respectively showing a two-dimensional layout and a cross-sectional structure of a semiconductor device according to Embodiment 1 of the present invention.
Figure 1B:
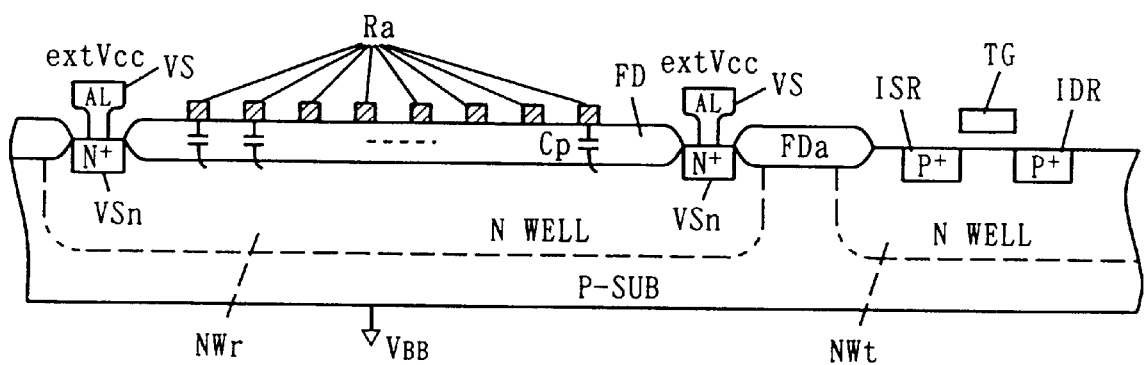

FIGS. 1A and 1B show the structure of the main portion of a semiconductor device according to Embodiment 1 of the present invention. FIG. 1A shows a two-dimensional layout of a resistance element according to Embodiment 1 of the present invention as well as of an insulating gate type field effect (MOS) transistor arranged adjacent to the resistance element. FIG. 1B schematically shows a cross-sectional structure taken along line 1A—1A in FIG. 1A.

Referring to FIG. 1A, resistance element R0 includes a plurality of elongated resistor portions Ra extending in the vertical direction of the drawing and second resistance portions Rb connecting the two ends of resistor portions Ra at adjacent locations alternately. Resistance element Ra has its one end connected to a node N1 via a contact hole and its other end connected to a power supply node (a particular node) 2aa via a contact hole. Surrounding the region where this resistance element R0 is formed, a conductor interconnection VS formed of, for example, aluminum is arranged. This conductor interconnection VS is connected to power supply node 2aa via a contact hole. This power supply node 2aa forms the other end of resistance element R0, and external supply voltage extVcc is supplied through power supply node 2a from a power supply line formed of, for example, aluminum interconnection at a layer above this conductor interconnection VS.

An N well NWr as a semiconductor well region having an n type impurity of low concentration is formed so as to surround this voltage supplying conductor interconnection VS when viewed in a two-dimensional layout. This N well NWr is electrically connected to voltage supplying conductor interconnection VS through a contact hole CT.

Adjacent to N well NWr provided to this region where resistance element is formed, an N well NWt for forming a transistor element is formed. Within this N well NWt, an insulating gate type field effect transistor (hereinafter referred to as MOS transistor) is formed. Referring to FIG. 1A, one MOS transistor is shown representatively. This MOS transistor includes a gate electrode layer TG which is to be a control electrode as well as impurity regions ISR and IDR which are to be source/drain regions.

Referring to FIG. 1B, an N well NWr is formed on the surface of P type semiconductor substrate P-SUB to which bias voltage VBB is applied. Along the periphery of this N well NWr, an n type impurity region VSn having a high concentration is formed for supplying external supply voltage extVcc to N well NWr. External supply voltage extVcc is supplied to this n type impurity region VSn of high concentration through conductor interconnection VS for supplying power supply voltage, and the voltage of N well NWr is fixed at the level of external supply voltage extVcc.

Within the impurity region VSn on the surface of this N well NWr, a field insulating film FD having the same thickness as that of the field insulating film FDa for element isolation is formed. At the surface of this field insulating film FD, resistance element R0 is formed. In FIG. 1B, only the cross-sectional structure of the first resistance portion Ra is represented. In addition, the drawing of FIG. 1B is simplified such that interlayer insulating film for providing electrical insulation between the interconnections and the gate insulating film formed at the lower portion of the gate electrode of the MOS transistor are not shown, in order to emphasize the characteristic feature of the structure of the present invention. Such omittance is made as appropriate for the structures of other embodiments described later.

In this region where resistor element is formed, a parasitic capacitance Cp is formed between resistance portion Ra and N well NWr. A second resistance portion Rb not shown also has a parasitic capacitance to the N well in a similar manner.

N well NWr and N well NWt are isolated from each other by a field insulating film FDa. At the surface of this N well NWt, p type impurity regions ISR and IDR having high concentration are formed.

In this FIG. 1B, the region where the transistor is formed is provided within N well NWt. However, N well NWt is provided for forming a p channel MOS transistor, and when an n channel MOS transistor is to be formed, a P well is formed instead of N well NWt. N well may be formed within this P well, or vice versa.

Field insulating films FD and FDa are formed by LOCOS (Local Oxidation of Silicon Oxide), but formation of field insulating film FDa followed by formation of N wells NWr and NWt may be performed before formation of field insulating film FD. Field insulating films FDa and FD may be formed simultaneously, followed by formation of only the N well NWr in a separate process by ion implantation of high energy.

By providing N well NWr for only the region where resistance element is formed, the potential of this N well NWr can be fixed at the level of external supply voltage extVcc independently from the potential of N well NWt of the region where the transistor is formed. N well NWt is also provided with a prescribed bias voltage via an impurity region of high concentration not shown.

FIGS. 1A and 1B show a structure in which combined parasitic capacitance Cpara of parasitic capacitance Cp formed between the resistance element and N well NWr is formed between the resistance element and external power supply node 2aa. In other words, the resistance element would have a parasitic capacitance to external supply voltage. Function and effect obtained when the potential of this N well NWr is fixed at the level of external supply voltage extVcc will be described next.

Figure 2A:
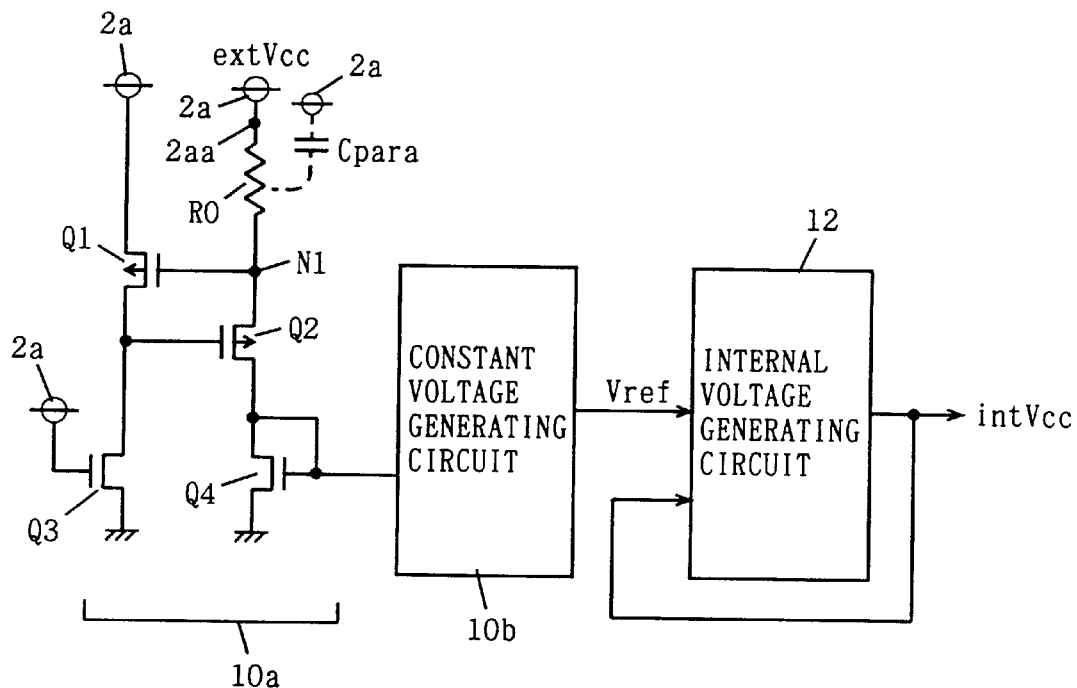
FIG. 2A is a schematic diagram showing an equivalent circuit of a constant current generating circuit of the semiconductor device according to Embodiment 1 of the present invention.
Figure 13:
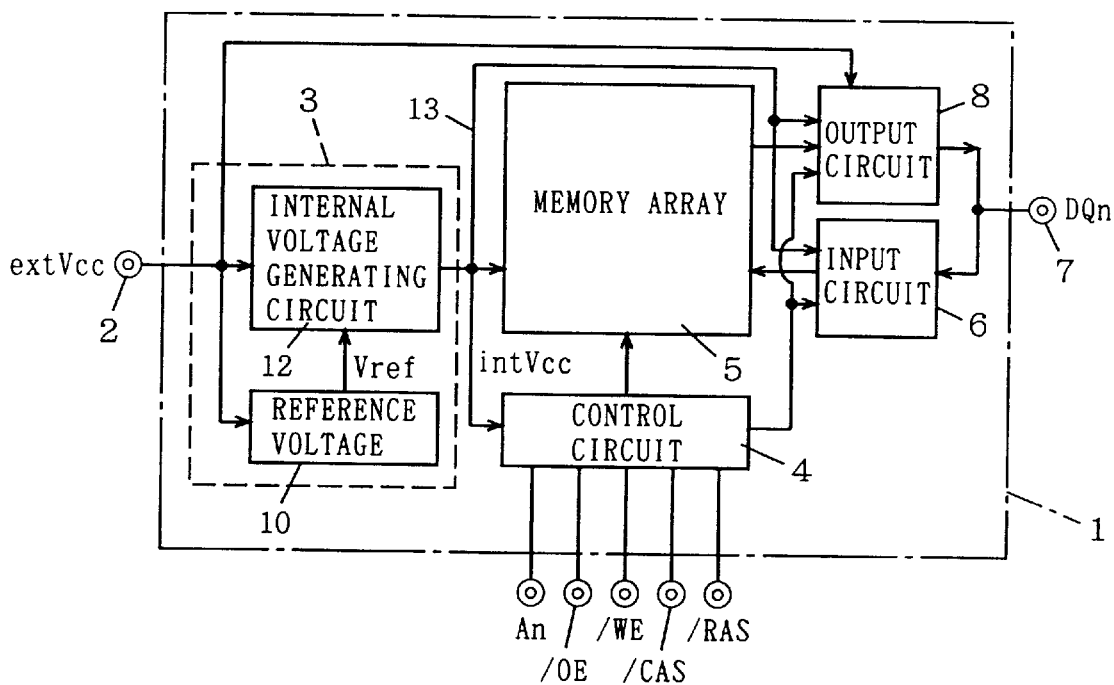
FIG. 13 schematically shows an entire structure of a conventional semiconductor device.
Figure 14:
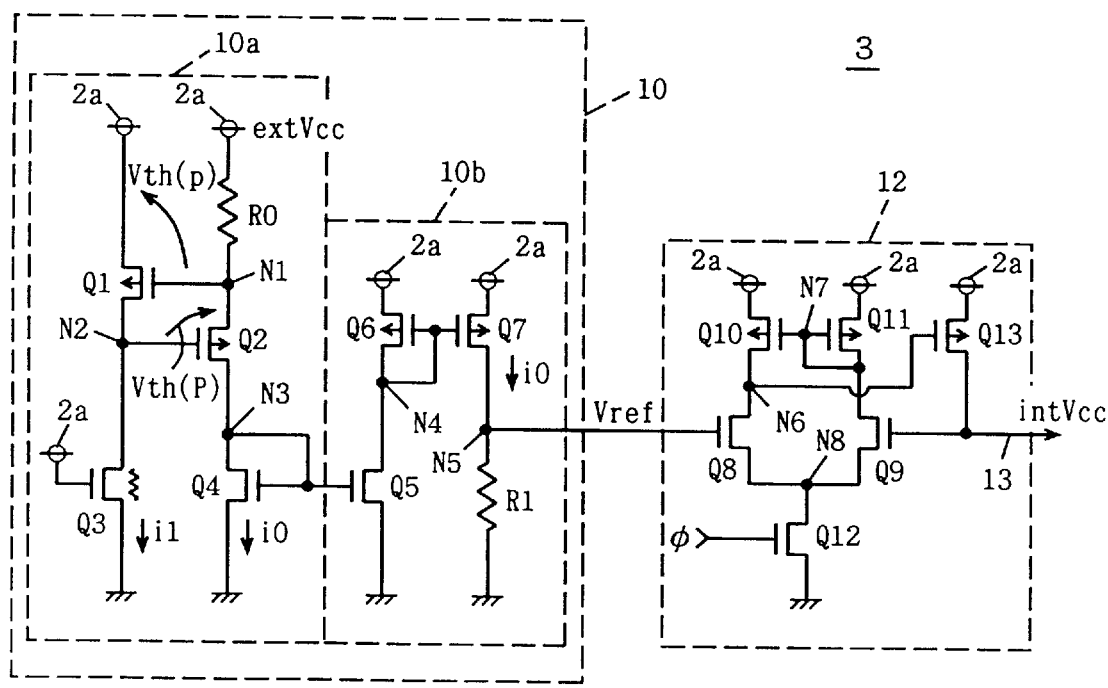
FIG. 14 shows a structure of an internal voltage down converter shown in FIG. 13.
Figure 15A:
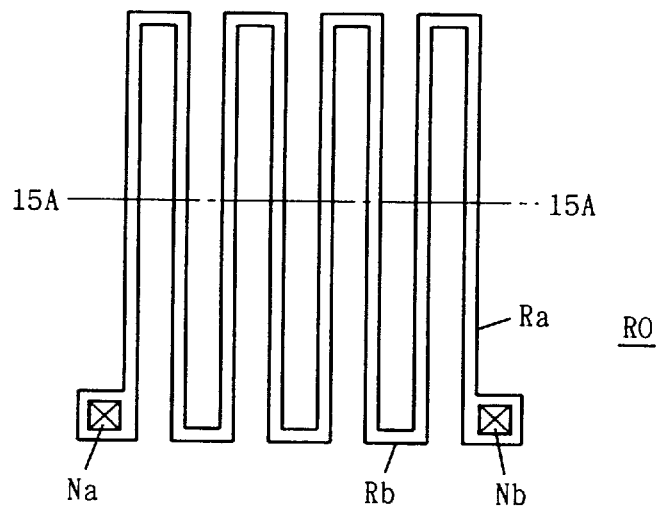
FIGS. 15A and 15B are schematic diagrams respectively showing a two-dimensional layout and a cross-sectional structure of a resistance element employed for a constant current generating circuit shown in FIG. 14.
Figure 15B:
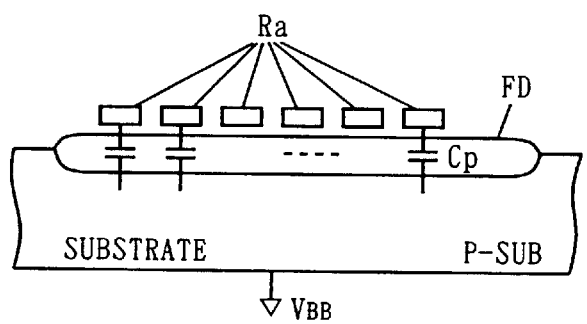
Figure 16A:
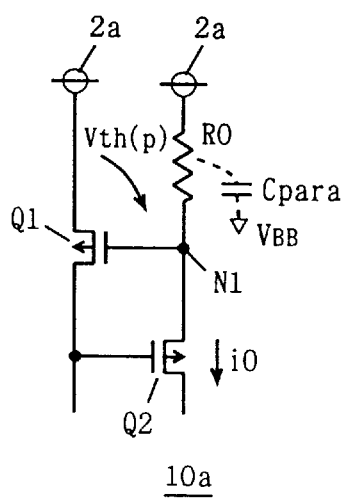
FIGS. 16A and 16B illustrate the problem encountered in the conventional constant current generating circuit.
Figure 16B:
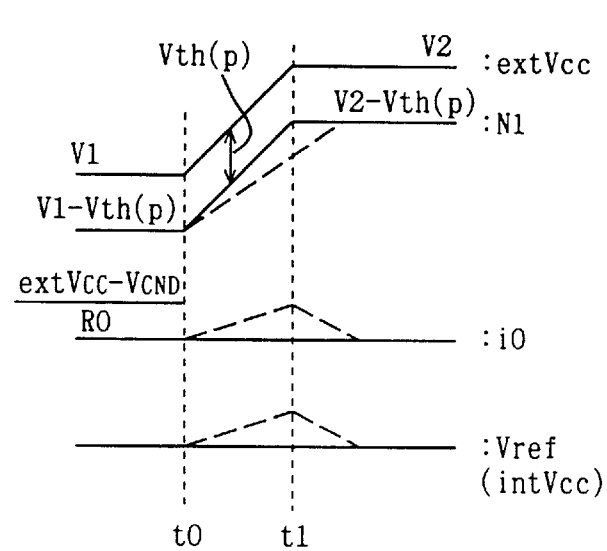

FIG. 2A shows an equivalent circuit in the case where the resistance element shown in FIGS. 1A and 1B is applied to the constant current generating circuit of FIG. 14. In a constant current generating circuit 10a, resistance element R0 has a parasitic capacitance Cpara formed to power supply node 2a. Other parts of the structure are the same as those shown in FIG. 13 and the corresponding portions are denoted by identical reference characters, and detailed description thereof is not provided here. Constant voltage generating circuit 10b and internal voltage generating circuit 12 are also of the same structure as shown in FIG. 13, and are simply indicated by blocks. Operation of constant current generating circuit 10a of FIG. 2A will now be described in the following with reference to FIGS. 2B and 2C.

Figure 2B:
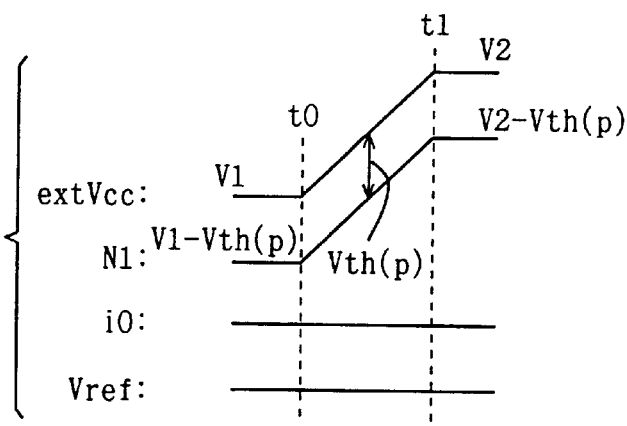
FIGS. 2B and 2C show waveforms indicating the operation of the semiconductor device shown in FIG. 2A upon generation of power supply noise.

Referring to FIG. 2B, voltage extVcc applied to external power supply node 2a is at the level of voltage V1 until time t0. Under this state, node N1 is at the voltage level of V1−Vth(p) and current i0 and reference voltage Vref are both held at a constant level.

At time t0, external supply voltage extVcc is increased. Parasitic capacitance Cpara is equivalently connected between node N1 and power supply node 2a. Accordingly, rise in voltage of power supply node 2a is conducted to node N1 by capacitive coupling of this parasitic capacitance Cpara. Accordingly, voltage of node N1 is also increased according to the increase in this external supply voltage extVcc. At this state, the voltage between power supply node 2a and node N1 is maintained constant at Vth(p). Therefore, constant current i0 is held at a constant current value, and correspondingly, reference voltage Vref also has its voltage level held at a constant level.

When external supply voltage extVcc attains voltage V2 at time t1, voltage at node N1 is also held at the level of voltage V2−Vth(p). If external supply voltage extVcc is held at the level of this voltage V2, the voltage level at node N1 is similarly held at the level of voltage V2−Vth(p).

As is shown in this FIG. 2B, even when supply voltage extVcc is made higher, the voltage between power supply node 2a and node N1 (i.e., the potential difference) is maintained constant at voltage Vth(p) and the voltage applied across resistance element R0 will not change. Accordingly, constant current i0 is held at a constant current level in a stable manner even when power supply noise is generated. Correspondingly, reference voltage Vref can also be held at a constant voltage level. Thus, internal supply voltage intVcc can be held at a constant voltage level even when external supply voltage extVcc is increased.

Figure 2C:
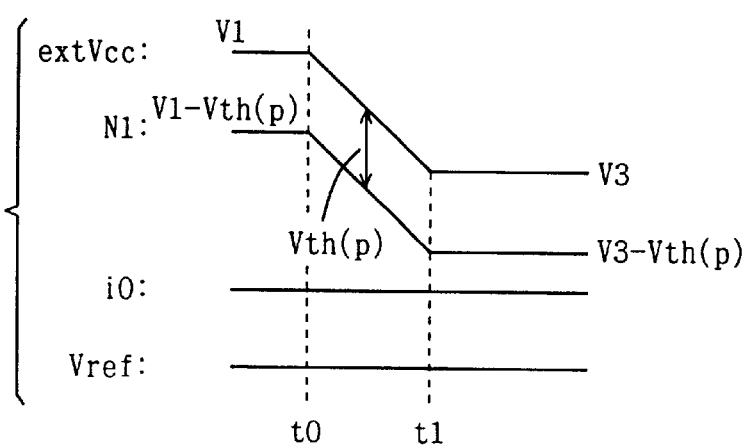

Referring to FIG. 2C, operation when external supply voltage extVcc is lowered will be descried.

Before time t0, external supply voltage extVcc is at a constant level of V1. Under this state, constant current i0 and reference voltage Vref are also held at a constant level. At time t0 when external supply voltage extVcc is lowered, this decrease in voltage level is conducted to node N1 through parasitic capacitance Cpara. Therefore, the difference between the voltage at node N1 and the voltage at power supply node 2a is constant even when external supply voltage extVcc is decreased, so that constant current flows through resistance element R0 and reference voltage Vref can be held at a constant voltage level.

When external supply voltage extVcc reaches and is stabilized at the level of voltage V3 at time t1, node N1 is similarly stabilized at the level of voltage V3−Vth(p). By fixing the voltage of N well NWr at the level of external supply voltage extVcc, it is possible to connect parasitic capacitance Cpara of node N1 with external power supply node 2a instead of the node for supplying negative bias voltage VBB.

By capacitive coupling of this parasitic capacitance Cpara, variation in voltage at power supply node 2a is conducted to node N1 and the voltage across both ends of resistance element R0 can be made constant, so that constant current/constant voltage generating circuit with superior power supply noise immunity can be implemented.

More specifically, by forming parasitic capacitance Cpara of resistance element R0 to external supply voltage extVcc, parasitic capacitance Cpara would not act as load capacitance to node N1. On the contrary, it operates actively as coupling capacitance, so that change in voltage at power supply node 2a can be conducted to node N1 with high speed.

Embodiment 2

Figure 3A:
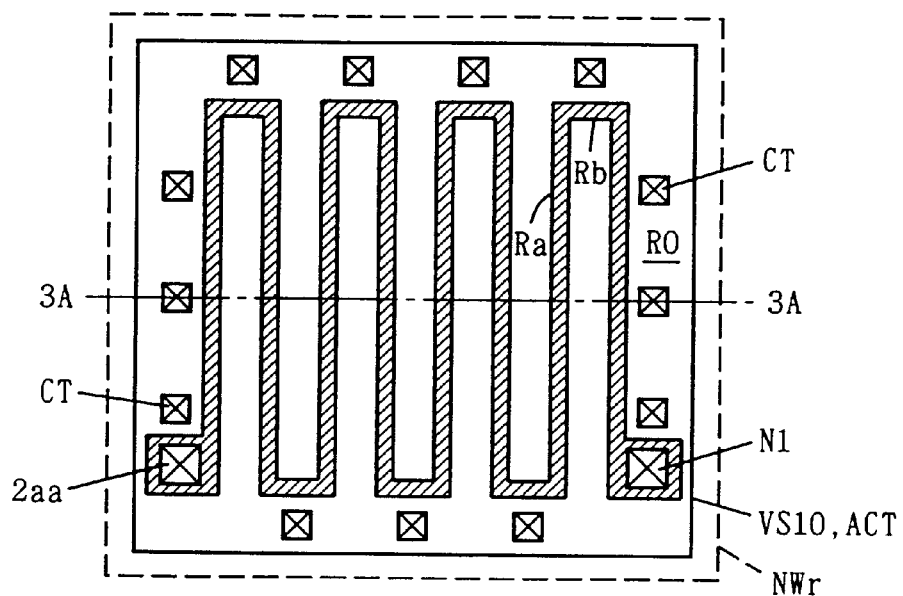
FIGS. 3A–3C are schematic diagrams respectively showing a two-dimensional layout, a cross-sectional structure and parasitic capacitance accompanying a resistor of a semiconductor device according to Embodiment 2 of the present invention.

FIG. 3A schematically shows a two-dimensional layout of a resistance element according to Embodiment 2 of the present invention. Referring to FIG. 3A, a resistance element R0 also includes a plurality of first resistance portions Ra arranged to extend vertically in the drawing and second resistance portions Rb for alternately connecting the adjacent first resistance portions Ra at their two opposite ends. This resistance element R0 is formed on an active region ACT. As will be described later, active region ACT represents an impurity region formed on a semiconductor layer surface. A conductor layer VS10 formed of an aluminum layer is provided at an upper layer of resistance element R0, overlapping this active region ACT when viewed two-dimensionally. This conductor layer VS10 is formed over the entire surface of active region ACT, covering resistance element R0.

An N type well region NWr is formed at the surface of the semiconductor layer so as to surround this active region ACT when viewed two-dimensionally. Resistance element R0 has its one end connected to node 2aa through a contact hole and its other end connected to node N1. Conductor layer VS10 is connected electrically with N well NWr through contact hole CT in a similar manner as in the Embodiment 1.

In comparison with the structure shown in FIG. 1A in which resistance element R0 is formed on the field insulating film, provision of a conductor interconnection formed of aluminum along the periphery of field insulation film is not required when resistance element R0 is formed on active region ACT, and thus the area occupied by the resistor element can be reduced.

Figure 3B:
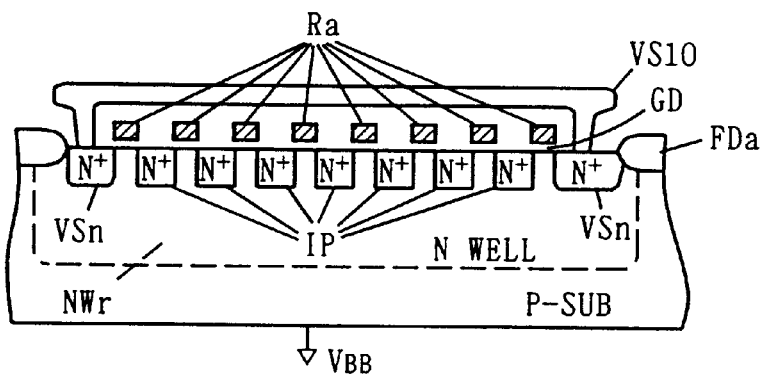

FIG. 3B schematically shows a cross-sectional structure taken along line 3A—3A in FIG. 3A. Referring to FIG. 3B, an N well NWr is formed at the surface of semiconductor substrate P-SUB fixed at a prescribed bias potential VBB, so as to surround active region ACT. A first resistance portion Ra of resistance element R0 is formed at the same interconnection layer as a control electrode of an MOS transistor not shown. More specifically, it is formed at the same interconnection layer as an electrode interconnection layer TG forming the control electrode of the MOS transistor shown in FIGS. 1A and 1B. This resistance element R0(Ra) is formed in the same manufacturing process as the process for formation of the control electrode of the MOS transistor. Accordingly, n type impurity regions IP and VSn having high concentration are formed in a self-aligned manner at the surface of N well NWr using this resistance element R0(Ra, Rb) as a mask, so as to reduce the electrode resistance of parasitic capacitance to allow fast movement of the electric charges. Impurity region VSn formed along the periphery of the active region is connected electrically to conductor layer VS10 for voltage supply. Conductor layer VS10 is formed to entirely cover this resistance element R0(Ra, Rb).

Figure 3C:
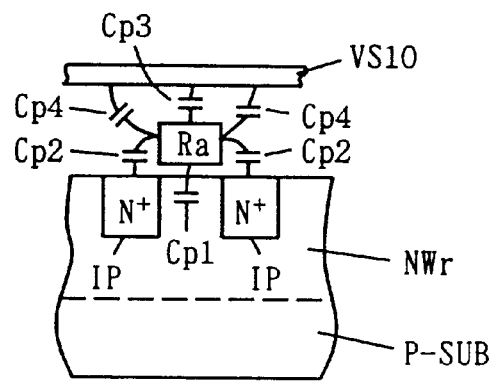

As to the structure of the resistance element shown in FIGS. 3A and 3B, the top and the bottom surfaces as well as the right and left side surfaces of resistance element R0 (Ra, Rb) respectively have a parasitic capacitance. Specifically, as shown in FIG. 3C, the bottom surface of resistance portion Ra (or Rb) has parasitic capacitance Cp1 to N well NWr, its right and left side surfaces having parasitic capacitance Cp2 to impurity region IP, and the surface having parasitic capacitance Cp3 to conductor layer VS10.

The gate insulating film formed between resistance element R0(Ra, Rb) and N well NWr has a thickness extremely smaller than the thickness of field insulating film. Accordingly, the capacitance value of this resistance element is sufficiently greater than in the case where the resistance element is formed on the field insulating film. In addition, parasitic capacitance is additionally formed between the resistance element and this conductor layer VS10, so that the capacitance is made further larger. Therefore, the value of the parasitic capacitance Cpara shown in FIG. 2A would be sufficiently great.

Normally, parasitic capacitance due to MOS transistors Q1 and Q2 exist with respect to node N1 (refer to FIG. 2A). In order to ensure that the change in potential at power supply node 2a is conducted to node N1, it is desirable that the value of parasitic capacitance Cpara is as great as possible. Upon capacitive coupling, the amount of injection/ extraction of the electric charges with respect to node N1 is proportional to the value of parasitic capacitance Cpara. If the value of parasitic capacitance Cpara is sufficiently greater than value of such parasitic capacitance other than this parasitic capacitance Cpara at node N1, change in potential at node N1 in accordance with the potential at power supply node 2a can be ensured by capacitive coupling.

Therefore, in the structure of resistance element shown in these FIGS. 3A and 3B, the value of parasitic capacitance Cpara can be made sufficiently great, so that change in potential at node N1 according to the change in potential at power supply node 2a can be ensured. Thus, potential difference between the two opposite ends of resistance element R0 can be made constant so as to stabilize the operation of this constant current generating circuit.

In addition, conductor layer VS10 at the upper layer of this resistance element R0 functions as a shield layer to prevent ultraviolet radiation and the like to resistance element R0. Thus, phenomenon of impact ionization upon ultraviolet radiation to polycrystalline silicon forming resistance element R0 is suppressed so as to suppress the generation of hole/electron pairs and the change of resistance value in resistance element R0.

Modification

Figure 4A:
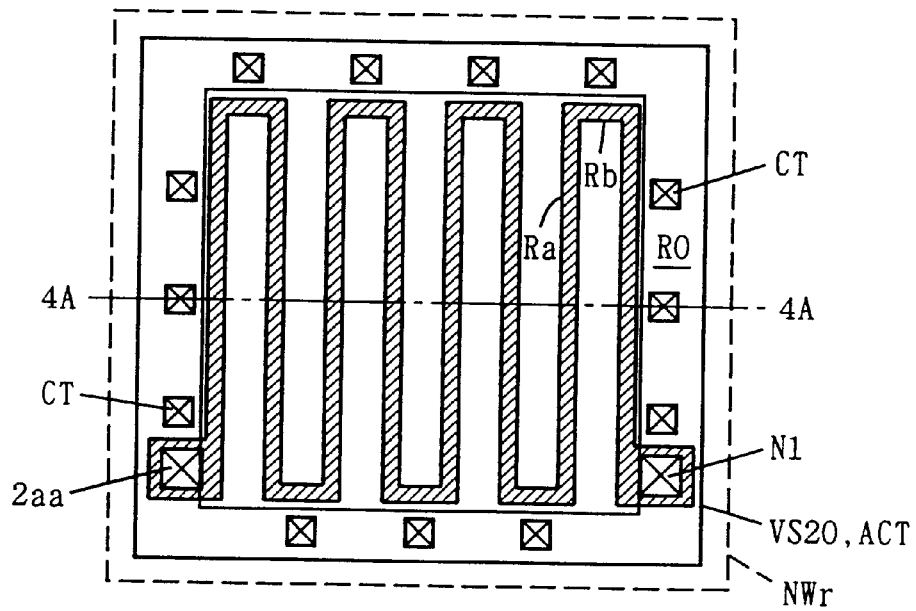
FIGS. 4A–4C are schematic diagrams respectively showing a two-dimensional layout, cross-sectional structure and parasitic capacitance of a modification according to Embodiment 2 of the present invention.
Figure 4B:
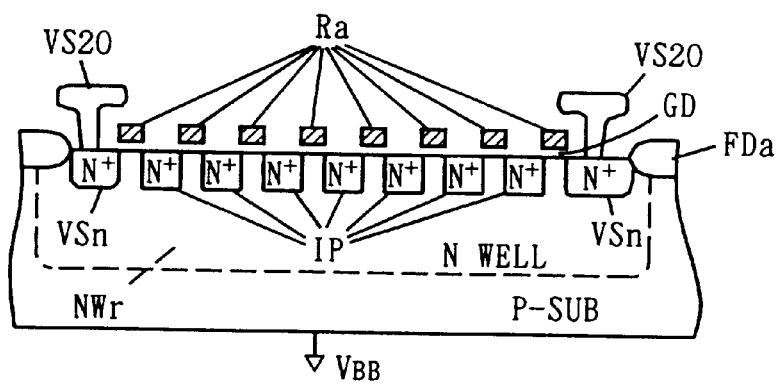
Figure 4C:
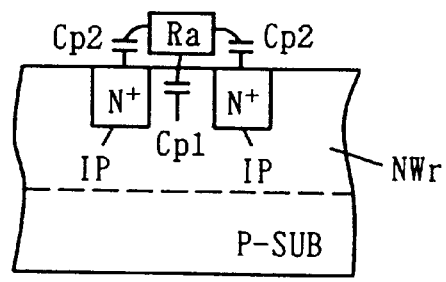

FIGS. 4A to 4C are schematic diagrams showing a structure of a modification of Embodiment 2 according to the present invention. FIG. 4A shows a two-dimensional layout of the modification of Embodiment 2 of the present invention, FIG. 4B shows a cross sectional structure taken along line 4A—4A of FIG. 4A, and FIG. 4C shows the distribution of parasitic capacitance. The structure shown in FIGS. 4A and 4B differs from the structure of FIGS. 3A and 3B in that conductor interconnection VS20 for fixing the potential of N well NWr is formed only along the periphery of resistance element R0. In the structure shown in these FIGS. 4A and 4B, each of the resistance portions (Ra, Rb) of resistance element R0 has parasitic capacitances Cp1 and Cp2 only to impurity region IP at the surface of well region NWr, as shown in FIG. 4C. Accordingly, although the value of parasitic capacitance is lowered as compared to the structure of FIGS. 3A and 3B since the conductor at the upper layer is not provided, the film thickness of gate insulating film GD is thin enough that the value of its parasitic capacitance Cpara can be made sufficiently great.

As in Embodiment 2 described previously, impurity region IP is formed at the surface of N well NWr so that the surface resistance of this N well NWr can be made small. Accordingly, the resistance of one electrode of parasitic capacitance Cpara can also be made small so as to enable fast movement of the charge at this electrode. Thus, change in external supply voltage extVcc can be conducted to parasitic capacitance (Cp1, Cp2) of each of the resistance portions with high speed and a parasitic capacitance with superior response characteristics can be implemented.

In accordance with Embodiment 2 of the present invention, resistance element is formed on the active region so that value of parasitic capacitance between this resistance element and the well region can be increased and thus the potential at node N1 can be changed accurately according to the change of external supply voltage extVcc, so as to implement stable circuitry.

Embodiment 3

Figure 5A:
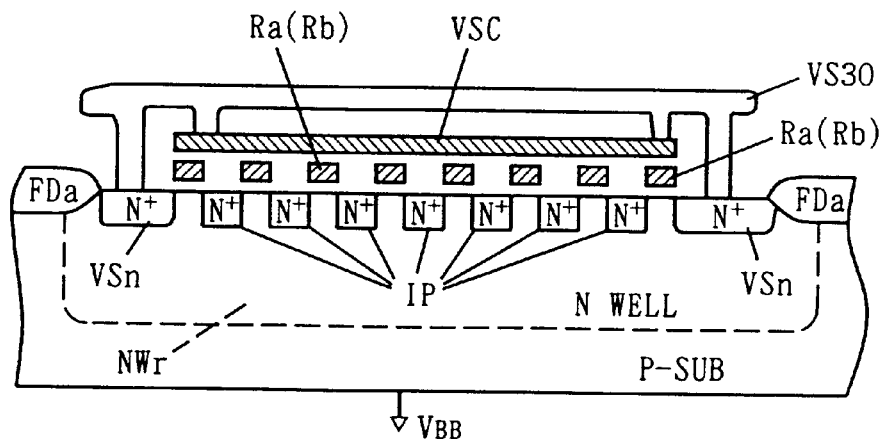
FIGS. 5A and 5B are schematic diagrams respectively showing a cross-sectional structure and parasitic capacitance of a semiconductor device according to Embodiment 3 of the present invention.

FIG. 5A schematically shows a cross-sectional structure of a main portion of a semiconductor device according to Embodiment 3 of the present invention. On the upper layer of a resistance portion Ra (Rb) of a resistance element R0 in the structure shown in this FIG. 5A, a voltage supplying conductor layer VSC is formed at a second polycrystalline silicon layer so as to cover the entire resistance element R0(Ra, Rb). On the upper layer of voltage supplying conductor layer VSC, a low resistance conductor layer VS30 formed from aluminum is formed covering this voltage supplying conductor layer VSC. Conductor layer VS30 is connected electrically to conductor layer VSC as well as to impurity region VSn formed at the surface of N well NWr. This conductor layer VS30 conducts external supply voltage extVcc. By forming a second polycrystalline silicon layer VSC covering this resistance element R0(Ra) at the upper layer, distance between conductor layer VSC and each of resistance portions Ra and Rb of the resistance element can be reduced and the parasitic capacitance of this resistance element R0 can be made larger, as compared to the arrangement shown in FIGS. 3A–3C.

Figure 5B:
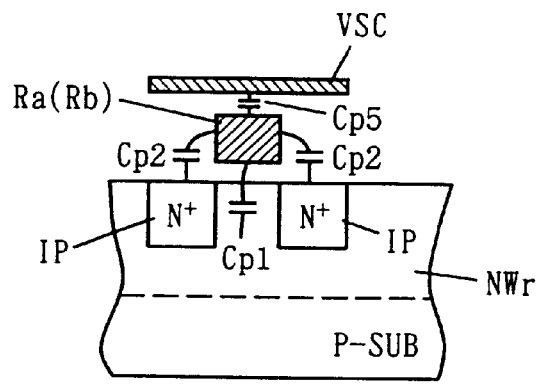

More specifically, parasitic capacitance Cp5 formed between voltage supplying conductor layer VSC and the facing surfaces of resistance portion Ra (Rb) as shown in FIG. 5B is made larger in capacitance value than the previously described parasitic capacitance Cp3 shown in FIG. 3C, and correspondingly, the value of combined parasitic capacitance Cpara can be increased. Here in FIG. 5B, the parasitic capacitance formed between the right and left side surfaces of resistance portion Ra (or Rb) and voltage supplying conductor VSC of the upper layer is not shown, in order to simplify the drawing.

Figure 6A:
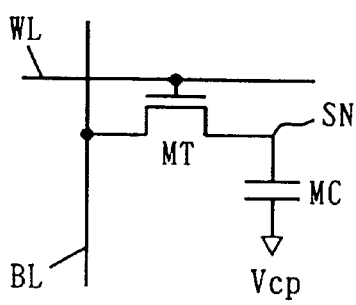
FIGS. 6A and 6B are schematic diagrams respectively showing an electrical equivalent circuit and its cross-sectional structure of a memory cell in a semiconductor memory device to which the semiconductor device of the present invention is applied.
Figure 6B:
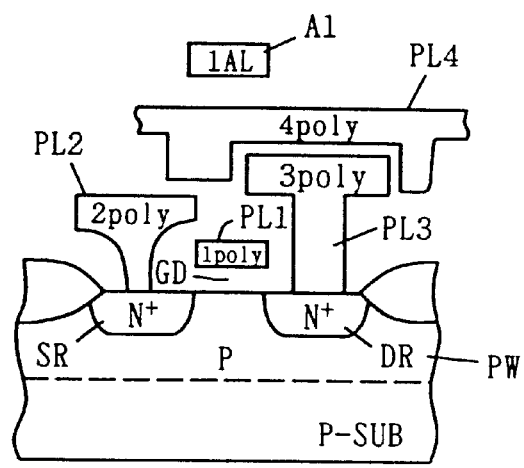

FIG. 6A shows an electrical equivalent circuit of a memory cell in the case where the semiconductor device is a semiconductor memory device, and FIG. 6B schematically shows the cross-sectional structure of this memory cell.

Referring to FIG. 6A, the memory cell is arranged corresponding to an intersection of a word line WL and a bit line BL. A row of memory cells are connected to word line WL while a column of memory cells are connected to bit line BL (i.e., bit line pairs BL, /BL). The memory cell includes a memory cell capacitor MC for storing information in the form of electrical charges, and an access transistor MT formed of n channel MOS transistor and rendered conductive in response to signal potential on word line WL for connecting this memory cell capacitor MC to bit line BL. Constant cell plate voltage Vcp is supplied to one electrode (cell plate) of memory cell capacitor MC. Charges of an amount corresponding to stored information are accumulated at the other electrode (storage node) SN of memory cell capacitor MC.

In FIG. 6B, the memory cell is formed at the surface of P type well PW at the surface of P type semiconductor substrate P-SUB. This access transistor MT includes N type impurity regions SR and DR of high concentration formed at the surface of P well PW and a gate electrode layer PL1 formed on the surface of P well PW between these impurity regions SR and DR, with a gate insulating film GT therebetween. Gate electrode layer PL1 is formed by a first level polycrystalline silicon layer. Impurity region SR is connected to a conductor interconnection PL2 formed from a second level polycrystalline silicon layer. This conductor interconnection PL2 provides a bit line BL.

Memory cell capacitor MC includes a conductor interconnection PL3 formed at a third level polycrystalline silicon layer connected to impurity region DR and a conductor interconnection PL4 formed at a fourth level polycrystalline silicon layer arranged facing to the upper surface of this conductor interconnection PL3 with an insulating film (not shown) therebetween. This conductor interconnection PL3 provides storage node SN and one electrode layer of memory cell capacitor MC, while conductor interconnection PL4 provides the cell plate electrode (the other electrode) of memory cell capacitor MC.

A metal interconnection A1 of a first level aluminum layer is formed on cell plate electrode interconnection PL4 formed of the fourth level polycrystalline silicon interconnection, and being parallel to conductor interconnection PL1. This metal interconnection A1 formed of aluminum is connected to conductor interconnection PL1 at a portion which is not shown. Conductor interconnection PL1 provides a word line WL and a gate electrode of the access transistor. By connecting this conductor interconnection PL1 and aluminum interconnection A1 having a low resistance, resistance of word line WL is made low.

This metal interconnection A1 is formed at the same interconnection layer where conductor layer VS30 shown in FIG. 5A is formed. Voltage supplying conductor layer VSC is formed at the second level polycrystalline silicon layer at the same interconnection layer as the layer where conductor interconnection PL2 for forming the bit line is formed. Accordingly, these conductor interconnections VSC and VS30 are formed in the same process as the process for manufacturing the memory cell.

In the structure shown in FIG. 6B, the distance between the bit line (conductor interconnection PL2) formed at the second level polycrystalline silicon layer and conductor interconnection(gate electrode interconnection) PL1 is made quite shorter than the distance between metal interconnection A1 formed at the first level aluminum interconnection layer and the second level polycrystalline silicon interconnection. Accordingly, the capacitance value of the parasitic capacitor between resistance element R0 and conductor interconnection VSC in FIG. 5A can be made sufficiently high.

In accordance with Embodiment 3 of the present invention, another conductor interconnection is formed between the conductor interconnection for fixing the well potential and the resistance element, and this another conductor interconnection is electrically connected to the conductor interconnection for fixing the well potential, so that parasitic capacitance between this another conductor interconnection and the resistance element can be increased. Accordingly, the value of parasitic capacitance Cpara of resistance element R0 to external supply voltage extVcc can be made sufficiently high and potential at node N1 can be changed fast and accurately in accordance with the level of external supply voltage extVcc, so that stabilization of the circuitry can be achieved.

The function as a shield layer to resistance element R0(Ra, Rb) is also implemented by conductor interconnection VS30 in the structure shown in FIG. 5A.

Embodiment 4

Figure 7:
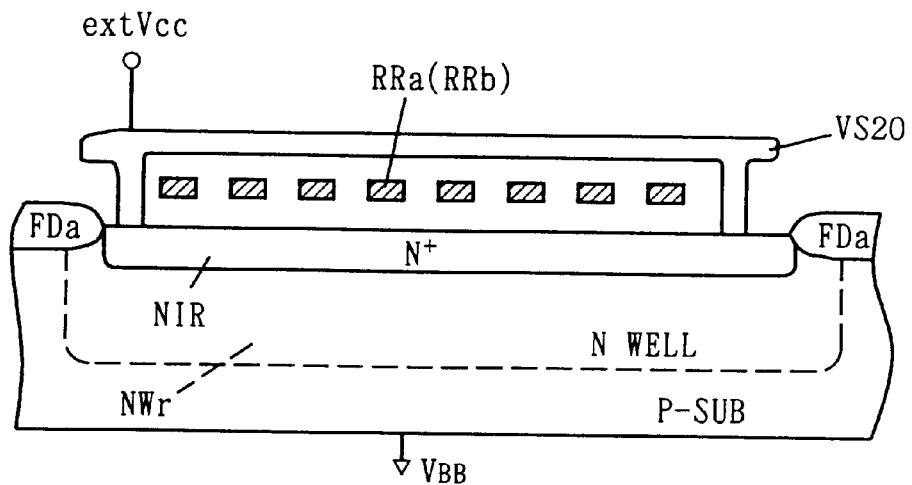
FIG. 7 is a schematic diagram showing a cross-sectional structure of a semiconductor device according to Embodiment 4 of the present invention.

FIG. 7 schematically shows a cross-sectional structure of a main portion of a semiconductor device according to Embodiment 4 of the present invention. In the structure shown in this FIG. 7, a resistance element is formed of a conductor layer of a second level polycrystalline silicon. In FIG. 7, resistance portion RRa (or RRb) of resistance element R0 is shown. Resistance portions RRa and RRb of this resistance element includes resistance portions arranged repeatedly in one direction at prescribed spacings and resistance portions disposed in the direction perpendicular to that one direction for electrically connecting the resistance element extending along that one direction.

In the case in which the second level polycrystalline silicon interconnection is used as this resistance element R0, the resistance element is not yet formed at the surface of this N well NWr when gate electrode of the MOS transistor is formed. By implanting n type impurity over the entire surface of this N well NWr during the process of impurity implantation for the MOS transistor, an n type impurity region NIR having a high concentration can be formed. This n type impurity region NIR is electrically connected to the upper layer of resistance element RRa (RRb) or to conductor interconnection layer VS20 formed to cover these resistance portions. Conductor VS20 is supplied with external supply voltage extVcc.

In the structure shown in this FIG. 7, n type impurity region NIR with low resistance is formed over the entire surface of N well NWr. Therefore, electrode resistance of the parasitic capacitance formed between this resistance portion RRa (RRb) and impurity region NIR is lowered, variation at external supply voltage extVcc is conducted rapidly over the entire surface of N well NWr, and potential at node N1 can be changed by the capacitive coupling according to the change in this external supply voltage extVcc, so that capacitor with superior response characteristics can be implemented and the constant current generating circuit can be operated in a stabilized manner.

Embodiment 5

Figure 8:
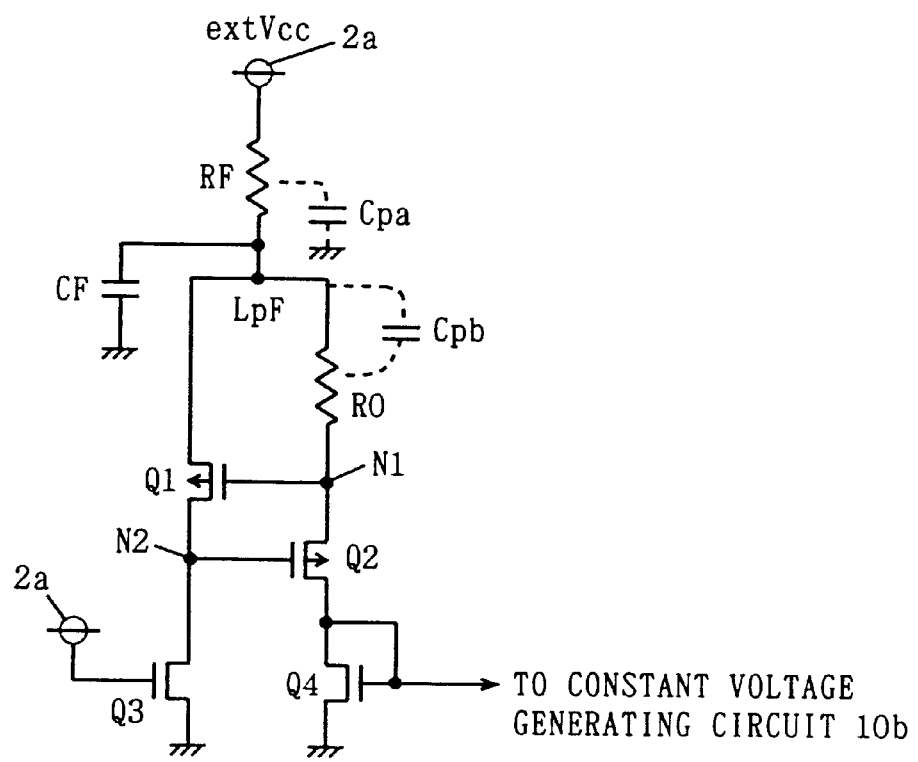
FIG. 8 shows a circuit structure of a semiconductor device according to Embodiment 5 of the present invention.

FIG. 8 schematically shows a structure of a main portion of a semiconductor device according to Embodiment 5 of the present invention. In FIG. 8, only the structure of the portion of a constant current generating circuit is shown. Referring to FIG. 8, a constant current generating circuit 10a includes a resistance element RF connected between an external power supply node 2a and a node LPF, and a capacitance CF connected between node LPF and a ground node. Parasitic capacitance Cpa is formed actively with respect to resistance element RF.

A resistance element R0 is connected between node LPF and a node N1. This resistance element R0 of which cross-sectional structure will be described later in detail has a structure similar to those of Embodiments 1 to 4. A well region formed below resistance element R0 is connected to node LPF, and parasitic capacitance Cpb accompanying this resistance element R0 is provided to node LPF. Structures of the other transistors Q1, Q2, Q3 and Q4 are the same as the structure previously shown with reference to FIG. 14, and description thereof is not repeated here.

In the structure of constant current generating circuit 10a shown in this FIG. 8, a low pass filter is formed by resistance element RF and capacitance CF. This capacitance CF and parasitic capacitance Cpa are connected in parallel. Therefore, by utilizing the element having the same structure as that of resistance element R0 shown in Embodiments 1 to 4 as this resistance element RF, it is possible to form a parasitic capacitance Cpa having a high capacitance value efficiently. In this case, parasitic capacitance Cpa is connected to a ground node rather than the external power supply node because the N well is coupled to receive the ground potential. Thus, even if external supply voltage extVcc is varied, noise at external supply voltage extVcc can be eliminated by the low pass filter formed of resistance element RF, capacitance CF and parasitic capacitance Cpa, so that potential at node LPF can be held at a constant potential level in a stabilized manner.

Resistance element R0 is connected between node LPF and node N1, MOS transistor Q1 is connected between node LPF and node N2, and the gate of MOS transistor Q1 is connected to node N1. This constant current generating circuit 10a performs a constant current generating operation using node LPF as the power supply node. The voltage at node LPF is at a stabilized level with noise thereat eliminated owing to resistance element RF, capacitance CF and parasitic capacitance Cpa. Thus, this constant current generating circuit 10a can produce a constant current in a stabilized manner without being influenced by variation in external supply voltage extVcc. In addition, even if voltage at node LPF is varied, this change in voltage at node LPF is conducted to node N1 by parasitic capacitance Cpb of resistance element R0, so that voltage between node LPF and node N1 can be maintained constant and a constant current of desired magnitude can be produced in a stabilized manner.

Figure 9A:
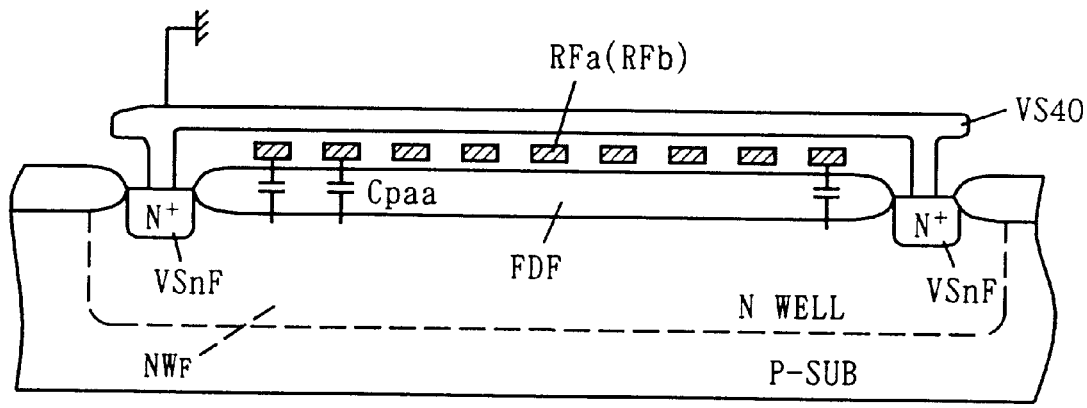
FIGS. 9A and 9B are schematic diagrams showing cross-sectional structures of the resistance element portions shown in FIG. 8.

FIG. 9A shows a structure of a portion of resistance element RF in FIG. 8. Referring to FIG. 9A, an N well NWF formed of n type impurity region having a low concentration is formed at the surface of P type semiconductor substrate P-SUB. At the surface of this N well NWF, a thick insulating film (hereinafter referred to as a field insulating film) FDF having the same thickness as that of element isolating field insulating film is formed. Resistance element RF is formed on this field insulating film FDF. In FIG. 9A, only the cross-sectional structure of the resistance portion RFa (or RFb) extending along one direction of this resistance element RF is shown. An n type impurity region VSnF having high concentration is formed at the surface of N well NWF so as to surround field insulating film FDF. At the upper layer of resistance element RF (RFa, RFb), a metal conductor interconnection VS40 of aluminum is formed to cover these resistance element portions. This metal conductor interconnection VS40 is connected to impurity region VSnF as well as to the ground node. Therefore, N well NWF is fixed at the ground potential. Semiconductor substrate P-SUB is biased to negative potential VBB.

In the structure shown in this FIG. 9A, parasitic capacitance Cpaa formed between resistance portion RFa (RFb) and N well NWF is formed to the ground node. The combined parasitic capacitance Cpa of this parasitic capacitance Cpaa is connected parallel to capacitance CF shown in FIG. 8. A required capacitance value can be implemented without enlarging the area occupied by capacitance CF, so that a low pass filter occupying only a small area can be implemented, and node LPF can be held at a constant voltage level in a stabilized manner without being influenced by the noise at external supply voltage extVcc.

Figure 9B:
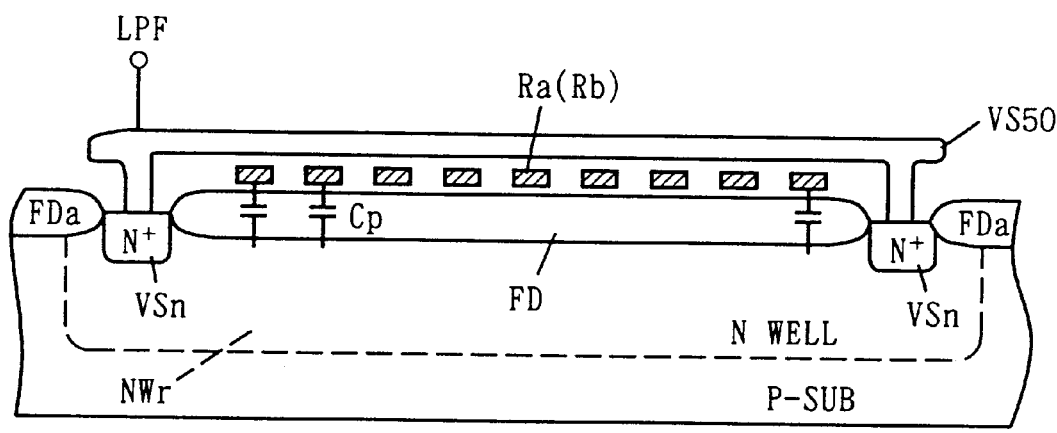

FIG. 9B shows the structure of a portion of resistance element R0 in FIG. 8. In this FIG. 9B, the cross-sectional structure of the portion of resistance portion Ra (Rb) of resistance element R0 is shown. These resistance portion Ra (Rb) are formed on field insulating film FD formed at the surface of N well NWr. Surrounding this field insulating film FD, n type impurity region VSn having a high concentration is formed along the periphery of N well NWr. A metal conductor interconnection VS50 of aluminum is formed at the upper layer of resistance portion Ra (Rb). This metal conductor interconnection VS50 is connected to node LPF as well as to n type impurity region VSn of high concentration. N well NWr is fixed at the voltage level of node LPF. Since node LPF is connected to power supply node 2a via resistance element RF shown in FIG. 9A, voltage from which noise is eliminated is conducted to node LPF and N well NWr is also held at a constant voltage level in stabilized manner. Parasitic capacitance Cp formed between resistance portion Ra (Rb) and N well NWr is formed with respect to node LPF. Therefore, even if the noise which had not been eliminated is conducted to node LPF by the low pass filter, the potential at node N1 is changed by the combined parasitic capacitance of this parasitic capacitance Cp, and the voltage applied across the opposite ends of resistance element R0 can be held at a constant voltage level. Metal conductor interconnection VS50 is formed at the upper layer of resistance element portion Ra (Rb) so as to cover resistance portion Ra (Rb).

Alternatively, either one of Embodiments 2 to 4 described previously may be employed instead of the resistance element and the structure for fixing the well potential shown in FIGS. 9A and 9B.

As described above, in accordance with Embodiment 5 of the present invention, external supply voltage is conducted from external power supply node to the power supply node of constant current generating circuit via the low pass filter so that it is possible to hold the potential at power supply node of this constant current generating circuit at a constant voltage level in a stabilized manner without the influence of noise of external supply voltage extVcc. As to the resistance element forming the low pass filter, the value of the capacitance included in the low pass filter can be set at high value with only a small area occupied, by providing a well region for the specific purpose and fixing this well region at the ground voltage level. In addition, in the constant current generating circuit, since the well region provided for the specific purpose to resistance element R0 for constant current generation is connected to the output node of this low pass filter, the voltage level between the opposite ends of the resistance element for constant current generation can be changed in accordance with the noise due to the parasitic capacitance of the resistance elements even if voltage having a noise not elimination is conducted to the internal power supply node, so that the voltage between the opposite ends of the resistance element for constant current generation can be held at a constant voltage level in a stabilized manner.

Embodiment 6

Figure 10:
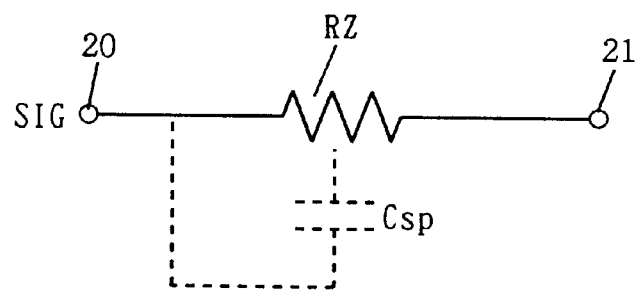
FIG. 10 shows a structure of a semiconductor device according to Embodiment 6 of the present invention.

FIG. 10 shows a structure of a main portion of a semiconductor device according to Embodiment 6 of the present invention. Referring to FIG. 10, a resistance element RZ is provided between a signal input node 20 and a node 21. A well region is provided for a specific purpose with respect to this resistance element RZ and is connected to signal input node 20. A signal SIG is conducted to node 21 through resistance element RZ for the purpose of reduction in voltage, limitation of current or the like. Upon this operation, resistance element RZ has its parasitic capacitance Csp connected to signal input node 20. Accordingly, change of the signal at signal input node 20 is conducted with high speed to node 21. Thus, signal SIG can be conducted faster to node 21 as compared to the case in which resistance element RZ has a parasitic capacitance to the ground.

In the structure shown in FIG. 10, either one of the Embodiments 1 to 4 as previously described may be employed as the structure of resistance element RZ and the conductor interconnection for fixing the well potential.

In accordance with Embodiment 6 of the present invention, a well region for a specific purpose is provided to a resistance element and is fixed at the potential of signal input node, and therefore, the signal applied to signal input node is conducted with high speed to the other end of the resistance element. If the other end of the resistance element is connected to, for example, the base of a bipolar transistor, the bipolar transistor can be operated in accordance with the input signal with high speed.

Embodiment 7

Figure 11:
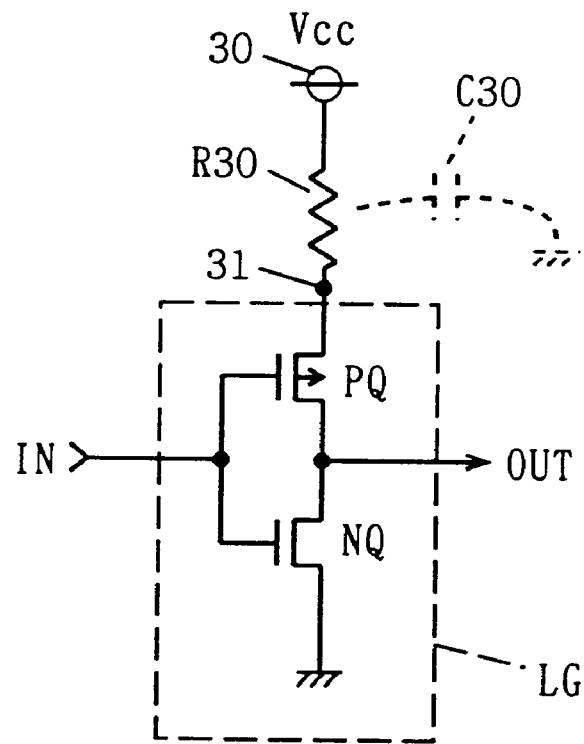
FIG. 11 schematically shows a structure of a semiconductor device according to Embodiment 7 of the present invention.

FIG. 11 schematically shows a structure of a semiconductor device according to Embodiment 7 of the present invention. Referring to FIG. 11, a resistance element R30 is connected between a power supply node 30 and an operational power supply node 31 of a logic gate LG. To this resistance element R30, a special-purpose well region is also provided as in the structure of Embodiments 1 to 4 previously described, and is fixed at the ground potential level. Logic gate LG, in one example, has a structure of a CMOS inverter formed of a p channel MOS transistor PQ and an n channel MOS transistor NQ.

In the case of the structure shown in this FIG. 11, resistance element R30 has a parasitic capacitance C30 with respect to the ground (The well potential is fixed at the ground potential). Accordingly, even when supply voltage Vcc on power supply node 30 is varied, the power supply noise is filtered by resistance element R30 and parasitic capacitance C30, or is absorbed by parasitic capacitance C30. Therefore, operational power supply node 31 of logic gate LG is stabilized and held at a constant voltage level. Logic gate LG never makes an erroneous determination of the logic level of this input signal IN, and even when power supply noise has occurred, logic gate LG performing a stable operation can be implemented. Here, parasitic capacitance C30 included in the low pass filter as a component has a well region formed facing to the region where the resistance element is formed, as its one electrode. Therefore, in the low pass filter formed by this resistance element and the capacitance element, there would be no need for the area occupied by the capacitance element so that circuitry allowing stabilization of supply voltage is possible with only a small area occupied can be implemented.

It may be noted that this logic gate LG is not limited to an inverter and may be any other logic gate having multiple inputs. Also, the resistance element may be provided at the ground node.

In accordance with Embodiment 7 of the present invention, a resistance element is provided between the operational power supply node of a logic gate and the power supply node to which the supply voltage is applied, and a well region fixed at the ground potential is provided only for the resistance element, so that power supply noise can be absorbed to stabilize the operational supply voltage of the logic gate with only a small area occupied.

Embodiment 8

Figure 12:
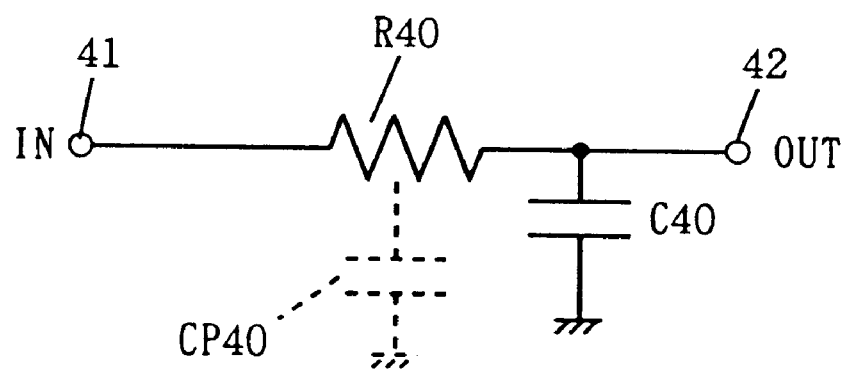
FIG. 12 schematically shows a structure of a semiconductor device according to Embodiment 8 of the present invention.

FIG. 12 shows a structure of a semiconductor device according to Embodiment 8 of the present invention. Referring to FIG. 12, a resistance element R40 is connected between an input node 41 and an output node 42, and a capacitance element C40 is connected between output node 42 and a ground node. Resistance element R40 is formed of polycrystalline silicon, and as in Embodiments 1 to 4, a well region for special purpose is provided to this resistance element R40. This well region provided only for resistance element R40 is connected to the ground node. Therefore, resistance element R40 has a parasitic capacitance CP40 with respect to the ground.

In the structure shown in this FIG. 12, a low pass filter is formed for filtering input signal IN applied to node 42 for production of an output signal OUT at an output node 42. In this low pass filter, a parasitic capacitance CP 40 is connected in parallel to capacitance C40. This parasitic capacitance CP40 has a relatively high capacitance value. Thus, it is possible to reduce the capacitance value of capacitance C40 and implement a low pass filter which occupies only a small area.

It may be noted that a constant current generating circuit of any structure can be utilized as long as a constant voltage is generated across the two ends of resistance element and a constant current is determined by the resistance value and the voltage applied across the two ends of the resistance element.

In accordance with the present invention, a well region is provided at the surface of the semiconductor layer facing to a resistor and is connected to a particular node, and thus even when noise is generated at one end of the resistor, the noise on the potential of the other end of the resistor is compensated for due to the capacitance between the semiconductor well region and the resistor, and thus it is possible to implement a semiconductor device with superior noise immunity.

Particularly, by connecting the well region to one end of the resister, the parasitic capacitance between the resistor and the well region would conduct variation in the potential at one end of the resistor to the other end of the resistor by capacitive coupling, so that it is possible to implement a semiconductor device with superior response characteristics.

By connecting this semiconductor well region and one end of the resistor to the supply voltage supplying node, the voltage applied across the two ends of the resistor can be set at a constant level even when noise is generated on the supply voltage, and accordingly, the current flowing through this resistor can be made constant.

Alternatively, by connecting the semiconductor well region to a node which receives a prescribed voltage different from the voltage at the two ends of the resistor, a large parasitic capacitance would be formed at the resistor, allowing absorption of a noise generated at one end of the resistor by this parasitic capacitance, so that it is possible to implement a semiconductor device with superior noise immunity.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
    a semiconductor layer of a first conductivity type;
    a semiconductor region of a second conductivity type formed on the semiconductor layer;
    an insulating film formed on the semiconductor region;
    a resistance element formed on the insulating film wherein the resistance element is connected between a first node and a second node;
    a particular node coupled, to the first node; and
    a voltage supplying means for supplying voltage of the particular node to said semiconductor region.

2. The semiconductor device according to claim 1, wherein said particular node is coupled to a node supplied with a predetermined voltage.

3. A semiconductor device, comprising:
    a semiconductor layer of a first conductivity type;
    a semiconductor region formed at a surface of said semiconductor layer and coupled to a particular node;
    an insulating film formed on the semiconductor region;
    a resistance element, formed above said insulating film, connected between a first node and a second node and formed in a region dedicated for said resistance element; and
    voltage supplying means for supplying a predetermined constant voltage different from the voltage at said first and second nodes to said semiconductor region through said particular node.

4. The semiconductor device according to claim 1, wherein said semiconductor region includes:
    a semiconductor well region of the second conductivity type having a first impurity concentration formed at the surface of said semiconductor layer; and
    an impurity semiconductor region of the second conductivity type formed at a surface of said semiconductor well region and coupled to receive the voltage from said voltage supplying means and having a second impurity concentration higher than said first impurity concentration.

5. The semiconductor device according to claim 1, further comprising:
    a field isolation film for element isolation located adjacent the semiconductor region, wherein said insulating film has the same thickness as that of the field isolation film.

6. The semiconductor device according to claim 1, further comprising an insulating gate type field effect transistor formed at a region other than the region where said resistance element is formed and having a control electrode formed of a first level conductor on said semiconductor layer, and wherein:
    said resistance element is formed at the same layer as and of the same material as that of said first level conductor.

7. The semiconductor device according to claim 1, further comprising an insulating gate type field effect transistor formed at a region other than the region where said resistance element is formed and having a control electrode formed of a first level conductor on said semiconductor layer, and wherein:
    said resistance element is formed at a layer above said first level conductor and of the same material as that of said first level conductor.

8. The semiconductor device according to claim 4, wherein said impurity semiconductor region further includes a plurality of island regions formed spaced apart from each other on a surface of said semiconductor well region.

9. The semiconductor device according to claim 1, wherein said voltage supplying means includes a conductor layer formed at a layer above said resistance element to cover said resistance element.

10. The semiconductor device according to claim 1, wherein said voltage supplying means includes:
    a first conductor layer formed at a layer above said resistance element to cover said resistance element; and
    a second conductor layer formed at a layer above said first conductor layer to cover said first conductor layer and connected electrically to said first conductor layer and said semiconductor region for application of the voltage at said particular node.

11. The semiconductor device according to claim 1, further comprising:
    a second resistance element formed at a region other than the region where said resistance element is formed, on the surface of said semiconductor layer with a second insulating film therebetween, and connected between a node receiving a predetermined first voltage and said first node to which said particular node is connected;
    a second semiconductor region formed adjacent the semiconductor region of the second conductivity type, at a surface of said semiconductor layer; and
    second voltage supplying means for supplying a second constant voltage different from said first voltage and the voltage at said particular node to said second semiconductor region.

12. The semiconductor device according to claim 11, wherein said second voltage supplying means includes a conductor layer formed at a layer above said second resistance element to cover said second resistance element.

13. The semiconductor device according to claim 1, further comprising constant current generating means coupled to said particular node and said second node for generating a constant voltage with no dependency on the voltage at said particular node between said first and second nodes of said resistance element and for generating a constant current determined by said constant voltage and the resistance value of said resistance element.

14. The semiconductor device according to claim 13, further comprising reference voltage generating means for receiving the constant current flowing through said resistance element from said constant current generating means for conversion into a voltage and generating a reference voltage with no dependency on the voltage at said particular node.

15. The semiconductor device according to claim 14, wherein:
    a voltage dependent on an external supply voltage is applied to said particular node, and wherein said semiconductor device further comprises:
    a current supplying drive element coupled between a node receiving said external supply voltage supplying and an internal power supply line conducting internal operational supply voltage for supplying current from said node receiving said external supply voltage supplying to said internal power supply line; and comparing/regulating means for comparing the voltage on said internal power supply line and the reference voltage from said reference voltage generating means to regulate an amount of current supplied by said current supplying drive element in accordance with the result of comparison.

16. The semiconductor device according to claim 1, wherein an external supply voltage is applied to said particular node.

17. The semiconductor device according to claim 3, further comprising a capacitance element connected between said second node and said particular node.

18. The semiconductor device according to claim 11, further comprising a capacitance element connected between a node receiving said second constant voltage and said particular node.

* * * * *